United States Patent

Aschner et al.

[11] Patent Number: 5,870,526
[45] Date of Patent: Feb. 9, 1999

[54] INFLATABLE ELASTOMERIC ELEMENT FOR RAPID THERMAL PROCESSING (RTP) SYSTEM

[75] Inventors: Helmut Aschner, Beimerstetten; Helmut Merkle, Tomerdingen; Ulrich Walk; Dieter Zernickel, both of Ulm, all of Germany

[73] Assignee: Steag-Ast, Germany

[21] Appl. No.: 895,665

[22] Filed: Jul. 17, 1997

[51] Int. Cl.⁶ .............................. A21B 2/00; L23L 14/00
[52] U.S. Cl. .................... 392/416; 219/390; 219/405; 219/411; 392/418; 118/725; 118/730; 118/50.1
[58] Field of Search ................... 219/410, 405, 219/416, 390, 411; 392/416, 418, 407; 118/725, 729, 730, 728, 733, 50.1

[56] References Cited

U.S. PATENT DOCUMENTS

| | | | |
|---|---|---|---|
| 4,533,820 | 8/1985 | Shimizu | 219/390 |
| 4,547,247 | 10/1985 | Warrenback | 156/345 |
| 4,632,624 | 12/1986 | Mirkovich | 414/217 |
| 5,179,677 | 1/1993 | Anderson | 219/405 |
| 5,516,367 | 5/1996 | Lei | 118/725 |
| 5,551,985 | 9/1996 | Brors et al. | 118/715 |
| 5,592,581 | 1/1997 | Okase | 392/418 |
| 5,645,301 | 7/1997 | Kingsford | 285/14 |
| 5,683,518 | 11/1997 | Moore | 118/730 |
| 5,708,755 | 1/1998 | Gronet | 118/725 |

*Primary Examiner*—Teresa Walberg
*Assistant Examiner*—Daniel Leon Robinson
*Attorney, Agent, or Firm*—Rodney T. Hodgson

[57] ABSTRACT

A rapid thermal processing (RTP) chamber is disclosed, wherein a transparent plate and a body are sealed with a gas tight seal, and wherein the gas tight seal is activated by inflating an inflatable element.

21 Claims, 2 Drawing Sheets

INFLATABLE ELASTOMERIC ELEMENT FOR RAPID THERMAL PROCESSING (RTP) SYSTEM

FIELD OF THE INVENTION

The present invention relates to an apparatus and method for sealing a large transparent quartz plate to the body of an RTP chamber using an inflatable O-ring to provide uniform pressure on the plate.

BACKGROUND OF THE INVENTION

Rapid Thermal Processing (RTP) is a versatile optical heating method which can be used for semiconductor processing as well as a general, well controlled, method for heating objects or wafers which are in the form of thin sheets, slabs, or disks. The objects are generally inserted one at a time into a chamber which has at least some portions of the chamber walls transparent to transmit radiation from powerful heating lamps. The transparent portion of the walls is generally quartz, which will transmit radiation up to a wavelength of 3 to 4 microns. These lamps are generally tungsten-halogen lamps, but arc lamps or any other source of visible and/or near infrared radiation may be used. The radiation from the lamps is directed through the transparent portions of the walls on to the surface of the object to be heated. As long as the objects absorb light in the near infrared or visible spectral region transmitted by the transparent portion of the walls, RTP techniques allow fast changes in the temperature and process gas for the different material processes and conditions. RTP allows the "thermal budgets" of the various semiconductor processing to be reduced, as well as allows the production of various metastable states which can be "frozen in" when the material is cooled rapidly.

RTP systems are relatively new. In the last 10 or 15 years, such systems were used only in research and development. The thrust of the work was increasing the temperature uniformity, and developing heating cycles and processes which decreased the thermal budget. Prior art RTP machines can heat unstructured, homogeneous materials in the form of a flat plate or disk, and produce temperature uniformities across the plate adequate for semiconductor processing processes.

The temperature control in current RTP systems is mostly performed by monochromatic (or narrow wavelength band) pyrometry measuring temperature of the relatively unstructured and featureless backside of semiconductor wafers. The results of the temperature measurement are generally used in a feedback control to control the heating lamp power. Backside coated wafers with varying emissivity can not be used in this way, however, and the backside layers are normally etched away or the temperature is measured using contact thermocouples.

A newer method of temperature control is the power controlled open loop heating described in U.S. Pat. No. 5,359,693, which patent is hereby incorporated by reference.

German patent DE42 23 133 C2, hereby incorporated by reference, discloses a method of producing relatively defect free material in RTP machines. Apparatus induced thermal inhomogeneities have been reduced in the last few years because of the demand for more uniform processing. Among the techniques used have been control of the individual lamp power, use of circular lamps, and rotation of the semiconductor wafers with independent power control.

Most RTP machines have a thin rectangular quartz reaction chamber having one end open. The reaction chamber is made from a set of flat quarts plates joined together ("welded") in a manner known in the art. Chambers meant for vacuum use often have a flattened oval cross section. Chambers could even be made in the form of a flat cylindrical pancake. In general, the chambers are used so that the thin objects to be heated are held horizontally, but they could also be held vertical or in any convenient orientation. The reactor chamber is usually thin to bring the lamps close to the object to be heated. The reactor chamber is opened and closed at one end with a pneumatically operated door when the wafer handling system is in operation. The door is usually made of stainless steel, and may have a quartz plate attached to the inside. The process gas is introduced into the chamber on the side opposite the door and exhausted on the door side. The process gas flow is controlled by computer controlled valves connected to various manifolds in a manner well known in the art.

As wafer sizes increase to 300 mm diameter, the quartz "boxes" are increasingly expensive to produce and to use. The amount and size of ancillary equipment inside the RTP chamber is increasing at the same rate. RTP chambers made from different materials, however, have difficulties in that the hot wafers radiate long wavelength infrared radiation, which heats the quartz walls of the RTP systems which are transparent only to visible and near infra-red light. It is thus difficult to seal the transparent walls of the system to the differing material of the non transparent walls, because the differential expansion of the different materials leads to relative motion of the various parts of the RTP chamber. The differential expansion leads to very non uniform forces at different portions of the quartz plates, and such forces can crack the very expensive plates.

Relative motion between the quartz plates and the other parts of the RTP chamber can "scrub" the sealing material and cause contamination of chamber. This contamination is particularly bad for chemical vapor deposition (CVD) of silicon-germanium, where the system must be extraordinarily clean and where the entire system must be "baked" to remove all traces of water vapor from the walls of the system, and where normal sealing materials outgas sufficient material to prevent good CVD growth. Metal gaskets must be used and must be compressed with high pressures, and upon non uniform heating of the quartz plates, the plates may crack.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. U.S. Pat. No. 5,580,830, assigned to the assignee of the present invention, hereby incorporated by reference, teaches the importance of the gas flow and the use of an aperture in the door to regulate gas flow and control impurities in the process chamber.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending patent application Ser. No. 08/537,409, assigned to the assignee of the present invention, hereby incorporated by reference, teaches the importance succeptor plates separated from the wafer.

Rapid thermal processing of III–IV semiconductors has not been as successful as RTP of silicon. One reason for this is that the surface has a relatively high vapor pressure of, for example, arsenic (As) in the case of gallium arsenide (GaAs). The surface region becomes depleted of As, and the material quality suffers. Copending patent application Ser. No. 08/631,265, assigned to the assignee of the present invention, hereby incorporated by reference, supplies a method and apparatus for overcoming this problem.

OBJECTS OF THE INVENTION

It is an object of the invention to produce an RTP system which is clean and gas tight, and which will remain clean and gas tight after many cycles of heating and cooling of the chamber.

It is an object of the invention to produce an RTP chamber which may be rapidly and easily disassembled for cleaning and for loading of ancillary equipment into the chamber.

It is an object of the invention to produce an RTP chamber which can be cleaned to ultra-high vacuum standards of cleanliness.

SUMMARY OF THE INVENTION

The quartz plate window of a processing chamber of an RTP system is sealed to the body of the chamber using an inflatable elastic element which presses uniformly on the window regardless of the relative motion of the window and the body as the window and the body heat up and cool down during the rapid thermal cycles of the RTP system.

DETAILED DESCRIPTION OF THE INVENTION

Figure 1:
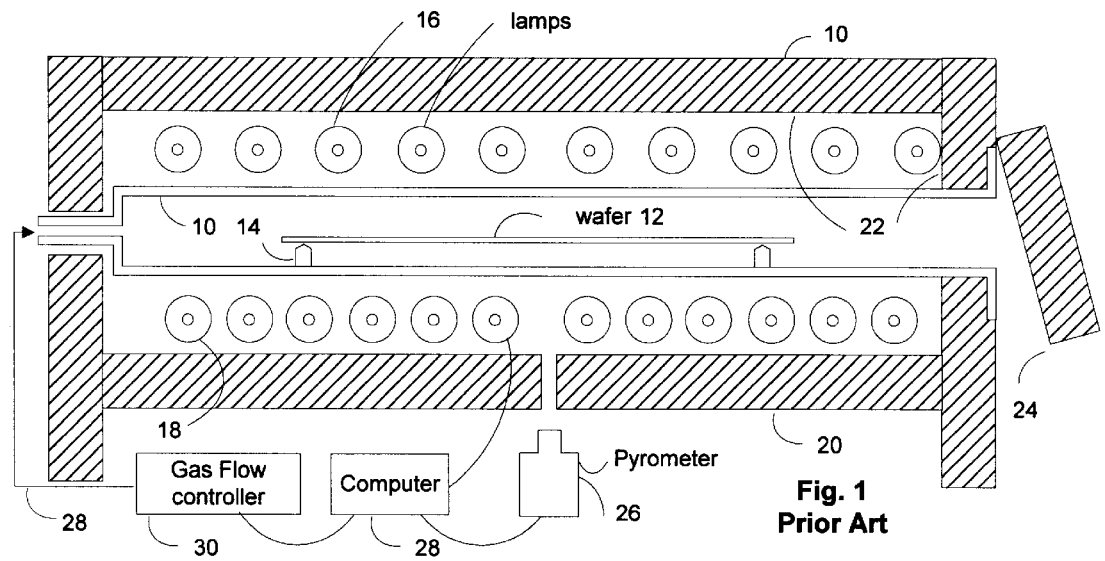
FIG. 1 is a sketch of a prior art open ended quartz reactor chamber RTP system with two banks of heating lamps.

FIG. 1 shows a cross sectional sketch of a prior art RTP chamber 10 with a wafer 12 supported by quartz pins 14 in position for heating by radiation from a set of lamps 16 and 18. The chamber 10 is supported by a housing 20 having highly polished interior walls 22. A door 24 is used to make a gas tight seal for the chamber 10. The temperature of the wafer 10 is measured by a pyrometer 26. A computer or other control means 28 receives the temperature reading from the pyrometer 26, and controls the lamps 16 and 18 to heat the wafer 12 according to a preprogrammed schedule. The computer 28 also serves to control a gas flow controller 30 which introduces process gas 28 into the chamber 10.

Figure 2:
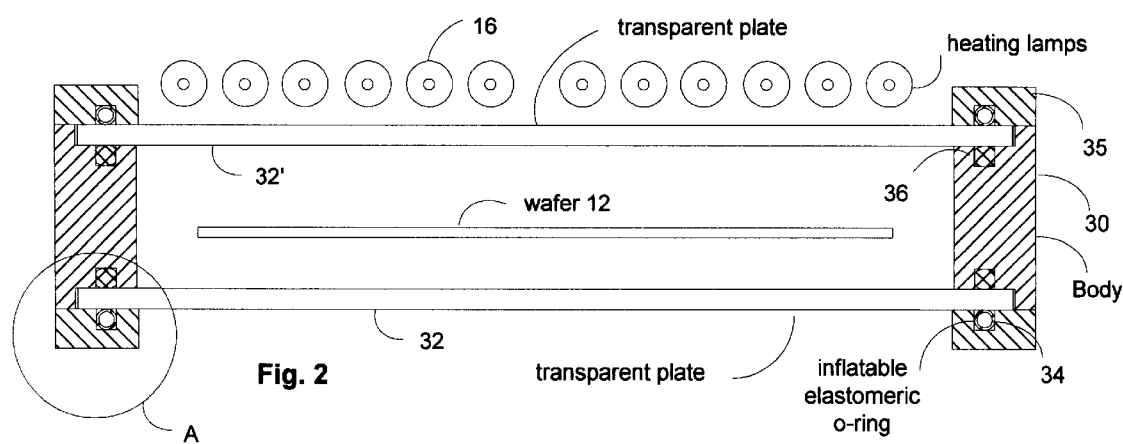
FIG. 2 is a sketch of the RTP chamber of the most preferred embodiment of the invention.

FIG. 2 shows the most preferred embodiment of the invention. The wafer 10 is held in position for processing by quartz pins (not shown). One set of lamps 16 is shown. The RTP chamber depicted in FIG. 2 comprises a body 30 and at least one plate 32 which is transparent to the radiation from the lamps 16 or other radiation sources as are known in the art of RTP. The body 30 of the chamber is preferably made from a metal such as aluminum or stainless steel. An opening (not shown) is machined in the body for inserting the wafer 10. A door (not shown) may be used for sealing this opening to retain process gases inside the chamber when the wafer 12 is being heated. The gas supply to the chamber is not shown. The gas supply system and the gas control system is well known in the art. The body 30 may be a hollow cylinder or a hollow rectangular shape.

The plates 32 and 32' are preferably made of quartz, which is substantially transparent to most of the radiation from the lamps 16. However, the quartz absorbs radiation with wavelengths longer than approximately 4 microns. When the wafer is hot, the wafer radiates energy in the far infrared having wavelengths longer than 4 microns, and such radiation is absorbed very readily in the quartz plate 32. The body 30 of the chamber may be readily water cooled, and the plate 32 cooled by air flow, but the differential temperatures between the body 30 and the plate 32, and the temperature differences over the plate 32, give rise to a relative motion of the body 30 and the plate 32. Typical sealing methods using O-ring seals and bolting the plate 32 against the body 30 often result in cracking of the quartz plate. It has been found that an inflatable member 34 such as an inflatable O-ring may be used as shown in FIG. 2 to apply steady pressure against the plate 32 when the inflatable elastic member is inflated. A ring 35 with an O-ring groove is shown for holding the inflatable O-ring 34 in place. A sealing element 36 may then be used to prevent gas flow between the body 30 and the plate 32 of the RTP chamber when the sealing is activated by inflating the inflatable element 34 to press the plate 32 against the sealing element 36. The sealing element 36 may be a elastomeric O-ring. The most preferable sealing element 36 is made from a fully fluorinated material such as Teflon™. Typical viton O-rings may be scrubbed by the relative motion of plate 32 and body 30, and contaminate the chamber and the wafer 12. In addition, the heat conducted from the center of the plate 32 to the outside of the plate can be transferred to the sealing element 36 and raise the temperature of the sealing element 36 to a point where it degrades and causes contamination. The use of a Teflon™ sealing element avoids both of these problems. The encircled area A shown in FIG. 2 shows an area of the drawing which will be shown in expanded form in later figures for the some of the various embodiments anticipated by the inventors.

The inflatable element 34 may be and inflatable elastomeric element, or it may be a metallic bellows arrangement to give the needed elasticity.

Figure 3:
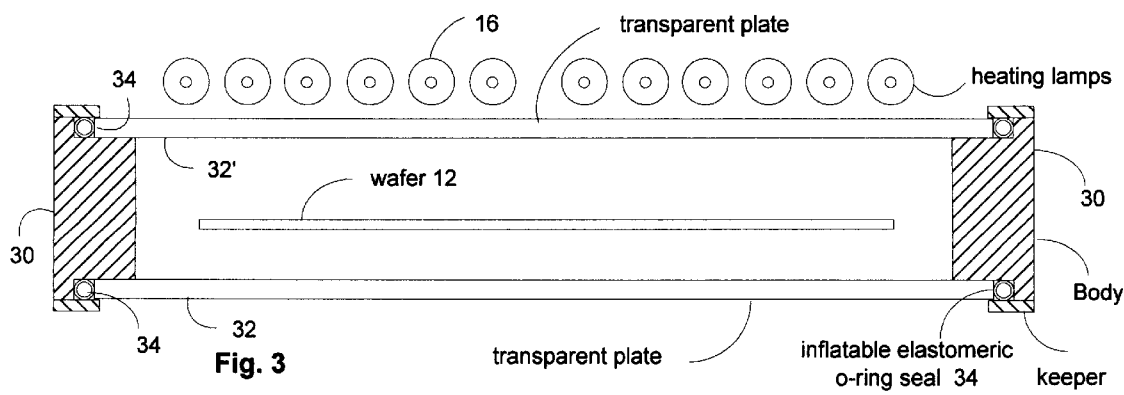
FIG. 3 is a sketch of the RTP chamber of a preferred embodiment of the invention.

FIG. 3 shows an alternative preferred embodiment of the invention, where the inflatable element 34 is stretched around the perimeter of a circular quartz plate 32. The relative motion of the plate 32 and the body 30 in this case compress the inflatable O-ring and does not lead to scrubbing of the surface of the inflatable O-ring. In the embodiment depicted in FIG. 3, the inflatable element itself seals the plate 32 to the body 30 when the inflatable element 34 is inflated. There are many cross sections for the inflatable element 34 which may be used in the embodiment sketched in FIG. 3 and other embodiments. The lines for the fluid used to inflate the inflatable element 34 are not shown in these sketches.

Figure 4:
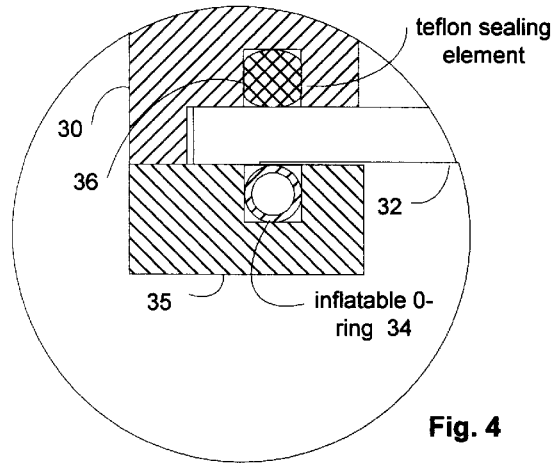
FIG. 4 is an expanded sketch of region A of FIG. 2.
Figure 5:
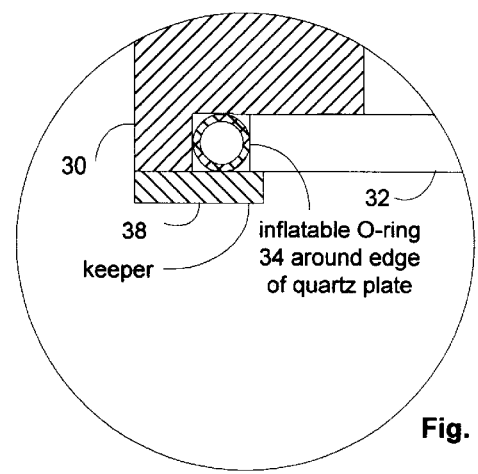
FIG. 5 is an expanded sketch of a region of FIG. 3.

FIG. 4 shows an expanded sketch of the area A of FIG. 2.
FIG. 5 shows a sketch of the corresponding portion of FIG.

Figure 6:
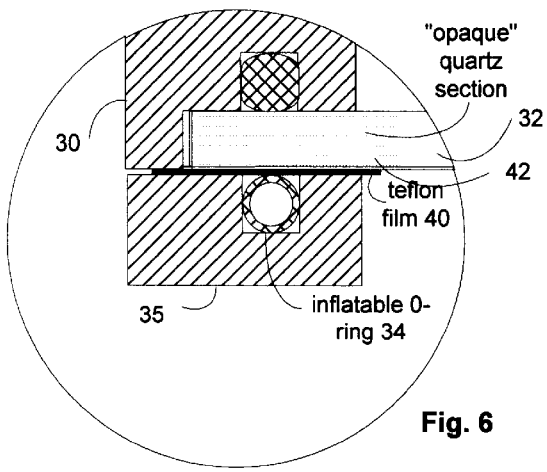
FIG. 6 is an expanded sketch of a preferred embodiment of the invention.

3. FIG. 6 shows a corresponding area for a system where the inflatable elastomeric element 34 of FIG. 2 is protected by a thin sheet 40 of Teflon™ from sticking to the plate 32 when the temperature of plate 32 rises. Also shown in FIG. 6 is a plate 32 made with the addition of "opaque" quartz 42 around the central area of plate 32. The opaque quartz 42 has many small vacuum filled voids which scatter the visible light from the lamps 16, and prevent the visible and near IR light from being "light piped" to the element 34 and which cut down on the heat thermally conducted from the center of the plate 32 to the perimeter of the plate 32.

Figure 7:
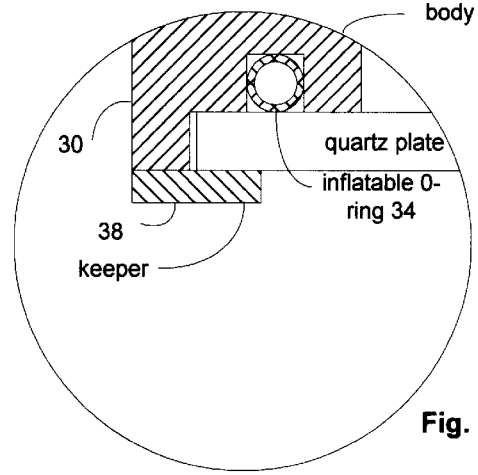
FIG. 7 is an expanded sketch of a preferred embodiment of the invention.

FIG. 7 shows a sketch of an inflatable O-ring 34 which is used to both seal and to apply the needed pressure to seal the body 30 to the plate 32.

Figure 8:
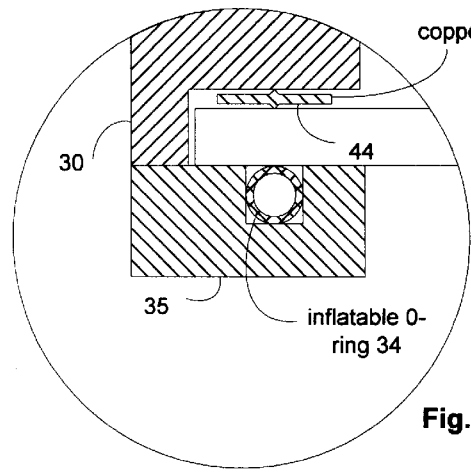
FIG. 8 is an expanded sketch of a preferred embodiment of the invention.
Figure 9:
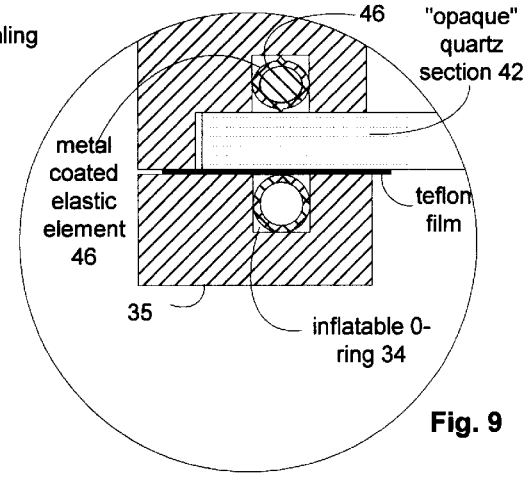
FIG. 9 is an expanded sketch of a preferred embodiment of the invention.

FIG. 8 shows the sealing element to be a soft copper gasket or seal 44 known in the art of ultra-high vacuum. Such a seal is necessary when utmost purity is needed in the chamber for work with, for example, Si-Ge CVD. An alternative and more preferred sealing element for such ultrahigh purity work is shown in FIG. 9, where a metal coated elastic element 46 is shown as the sealing element.

While the foregoing specification deals with single element quartz or other transparent plates, it is anticipated by the inventors that transparent plates joined with metal in a manner known in the art may also be sealing in the manner shown above.

The authors anticipate that many different kinds of inflatable elastic elements may be used to activate the sealing of an RTP chamber. In particular, it may be that higher temperature materials may be used or invented for such a use, and that particular shapes may be well suited for particular processes. The use of such new materials and different shapes will become obvious to one skilled in the art as a result of this disclosure.

We claim:

1. A rapid thermal processing (RTP) chamber, comprising;
    a body, and
    a plate held in close proximity to the body, at least a portion of the plate transparent to radiation from radiation sources of an RTP system, the plate forming a gas tight seal to the body, the gas tight seal activated by an inflatable element.

2. The apparatus of claim 1, wherein a sealing element is placed between the body and the plate, and wherein the inflatable element presses the plate and the body relatively together when the inflatable element is inflated.

3. The apparatus of claim 2, where an inert, high temperature resisting material is placed between the inflatable element and the plate.

4. The apparatus of claim 3, where the inert, high temperature resisting material is Teflon™.

5. The apparatus of claim 2, where the sealing element is a Teflon™ sealing element.

6. The apparatus of claim 2, where the sealing element is a copper gasket ultrahigh vacuum sealing element, and the sealing element contacts the portion of the plate transparent to radiation from radiation sources of the RTP system.

7. The apparatus of claim 2, where the sealing element is a metal covered elastomeric sealing element, and the sealing element contacts the portion of the plate transparent to radiation from radiation sources of the RTP system.

8. The apparatus of claim 1, wherein the inflatable element is located between the plate and the body.

9. The apparatus of claim 1, wherein the plate is a circular plate having a perimeter, and the inflatable element is located around the perimeter of the plate.

10. The apparatus of claim 1, wherein the plate is a quartz plate having a region near the perimeter of the plate which scatters the radiation.

11. A rapid thermal processing (RTP) system, comprising;
    a source of radiation;
    an RTP chamber comprising a body and a plate held in close proximity to the body, at least a portion of the plate transparent to radiation from the radiation source, the plate forming a gas tight seal to the body, the gas tight seal activated by an inflatable element;
    a gas control means for introducing a gas into the RTP chamber; and
    a means of controlling the source of radiation to heat an object contained in the RTP chamber and a means of controlling the gas control means to surround the object with a suitable gas when the object is being heated.

12. The system of claim 11, wherein a sealing element is placed between the body and the plate, and wherein the inflatable element presses the plate and the body relatively together when the inflatable element is inflated.

13. The system of claim 12, where an inert, high temperature resisting material is placed between the inflatable element and the plate.

14. The system of claim 13, where the inert, high temperature resisting material is Teflon™.

15. The system of claim 12, where the sealing element is a Teflon™ sealing element.

16. A method of rapid thermal processing (RTP) of an object using an RTP system, comprising;
    placing the object in an RTP chamber, the RTP chamber having a body and a plate heldin close proximity to the body, at least a portion of the plate transparent to radiation from radiation sources of the RTP system, the plate forming a gas tight seal to the body, the gas tight seal activated by an inflatable element; and
    heating the object with radiation from the radiation source.

17. The method of claim 16, wherein a sealing element is placed between the body and the plate, and wherein the inflatable element presses the plate and the body relatively together when the inflatable element is inflated.

18. The method of claim 17, where an inert, high temperature resisting material is placed between the inflatable element and the plate.

19. The method of claim 18, where the inert, high temperature resisting material is Teflon™.

20. The method of claim 17, where the sealing element is a Teflon™ sealing element.

21. A rapid thermal processing (RTP) chamber, comprising;
    a body,
    a plate held in close proximity to the body, at least a portion of the plate transparent to radiation from radiation sources of an RTP system,
    a sealing element placed between the body and the plate,
    inflatable element for pressing the plate and the body relatively together when the inflatable element is inflated, whereby a gas tight seal between the plate and the body is effected.

* * * * *